United States Patent
Fontanella et al.

(10) Patent No.: US 6,222,351 B1
(45) Date of Patent: Apr. 24, 2001

(54) DUAL SUPPLY DEVICE WITH A SINGLE DIRECT-CURRENT/DIRECT-CURRENT CONVERTER AND CAPACITIVE TRANSLATOR

(75) Inventors: Luca Fontanella, Venice; Giovanni Frattini, Travacò-Pavia; Giulio Ricotti, Broni-Pavia, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/490,910

(22) Filed: Jan. 25, 2000

(51) Int. Cl.$^7$ ............................................... G05F 1/577
(52) U.S. Cl. ................................. 323/267; 323/222
(58) Field of Search ............................ 323/222, 267, 323/282, 284

(56) References Cited

U.S. PATENT DOCUMENTS 5,751,139 * 5/1998 Jordan et al. ........................... 323/222
5,894,214 * 4/1999 Jiang ..................................... 323/222

* cited by examiner

Primary Examiner—Shawn Riley
(74) Attorney, Agent, or Firm—Theodore E. Galanthay; E. Russell Tarleton; Seed IP Law Group PLLC

(57) ABSTRACT

A dual supply device having a reference terminal, an input terminal for the application of a substantially constant input voltage relative to the reference terminal, a first output terminal for supplying a first supply voltage different from the input voltage, a second output terminal for supplying a second supply voltage substantially opposite to the first supply voltage a direct-current/direct-current converter connected between the input terminal and the first output terminal for converting the input voltage into the first supply voltage, and a capacitive translator connected between the first and second output terminals for translating the first supply voltage into the second supply voltage.

17 Claims, 2 Drawing Sheets

DUAL SUPPLY DEVICE WITH A SINGLE DIRECT-CURRENT/DIRECT-CURRENT CONVERTER AND CAPACITIVE TRANSLATOR

FIELD OF THE INVENTION

The present invention relates to a voltage supply device and, more particularly, to a dual voltage supply device that receives a single input voltage and outputs the supply voltages of substantially opposing polarities and similar value that differs from the value of the input voltage.

BACKGROUND OF THE INVENTION

Supply devices are used whenever it is necessary to have direct-current supply voltages (of substantially constant value, irrespective of a load connected). In some applications such as, for example, driver circuits for piezoelectric actuators, a dual supply device is required to provide a double supply and, in particular, a positive supply voltage and a negative supply voltage of opposite values relative to a reference value (or ground); the positive and negative supply voltages are typically obtained from a main supply voltage of a different absolute value.

A known solution consists of the use of two direct-current/direct current (dc/dc) converters or choppers, which obtain the positive supply voltage and the negative supply voltage, respectively, from the main supply voltage. The dc/dc converters are formed by switching systems. Each dc/dc converter comprises a control circuit which switches a power transistor so as to generate a voltage with a rectangular wave form and with a predetermined mean value; and filtering elements, typically comprising an inductor and a capacitor, that enable a direct-current voltage (equal to this mean value) to be obtained from the rectangular wave-form voltage.

A disadvantage of the supply device described above is that it requires two separate control circuits, which are quite complex. Moreover, the use of two inductors makes the supply device extremely expensive, particularly when all of its other components are produced in integrated form in a single chip of semiconductor material.

A different known solution consists of the use of a single inductor with a central tap (or an autotransformer). It is thus possible to have a single dc/dc converter (with a single control circuit), the power transistor of which is connected to a terminal of the inductor (with the central tap connected to ground). The positive supply voltage and the negative supply voltage are thus obtained from the main supply voltage at the two terminals of the inductor, respectively.

However, the need to use an inductor with a central tap or an autotransformer (instead of a normal inductor) keeps the cost of this supply device quite high.

SUMMARY OF THE INVENTION

The disclosed embodiments of the invention are directed to a dual supply device having a reference terminal, an input terminal for the application of a substantially constant input voltage relative to the reference terminal, a first output terminal for supplying a first supply voltage different from the input voltage, and a second output terminal for supplying a second supply voltage substantially opposite to the first supply voltage; the dual supply device further includes a direct-current/direct-current converter connected between the input terminal and the first output terminal for converting the input voltage into the first supply voltage, and a capacitive translator connected between the first and second output terminals for translating the first supply voltage into the second supply voltage.

BRIEF DESCRIPTION OF THE DRAWINGS

Further characteristics and the advantages of the dual supply device according to the present invention will become clear from the following description of a preferred embodiment thereof, given by way of non-limiting example, with reference to the appended drawings, in which.

DETAILED DESCRIPTION OF THE PREFERRED EMBODIMENT

Figure 1A:
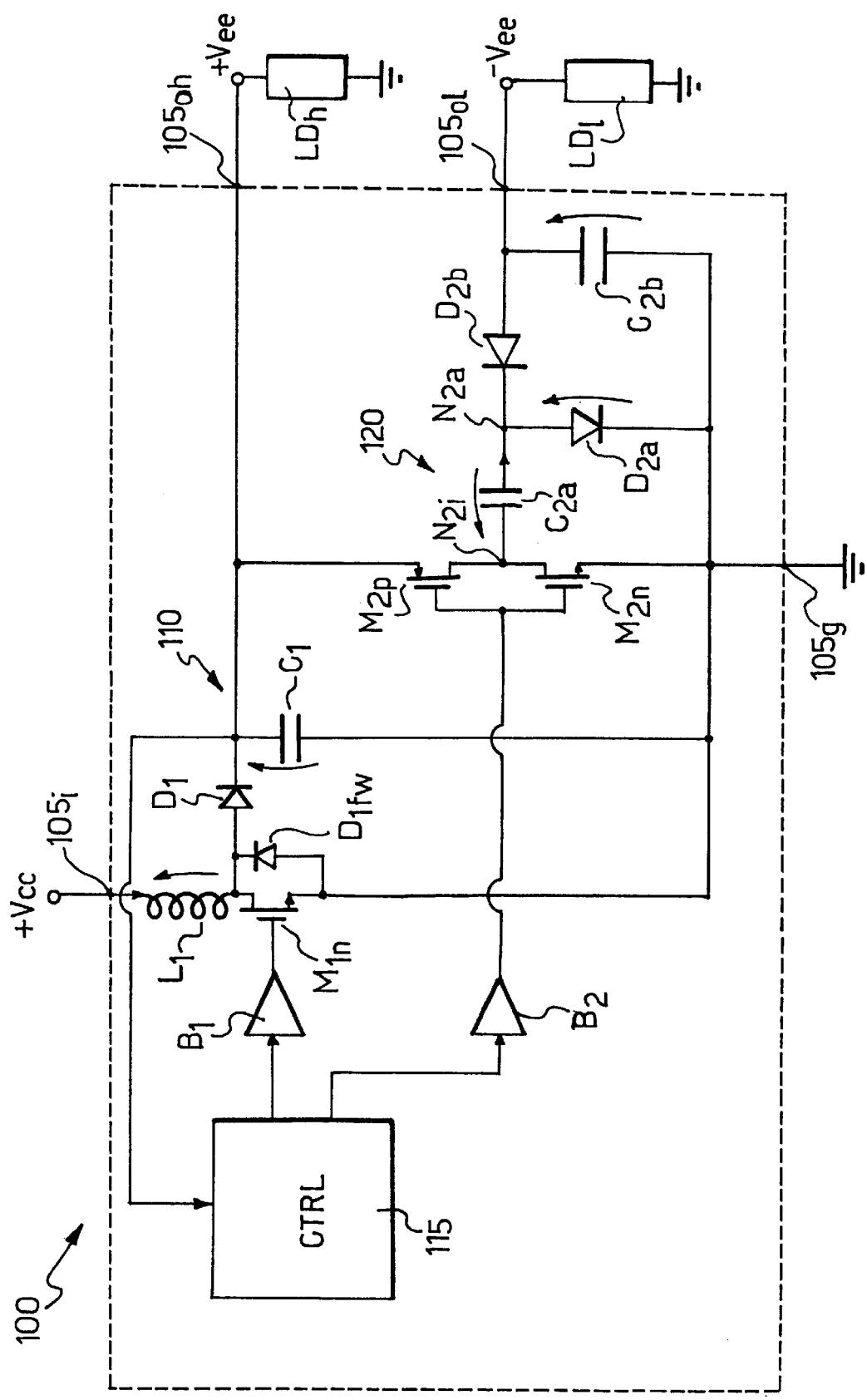
FIG. 1a is a basic circuit diagram of the supply device.

With reference to FIG. 1a in particular, this shows a dual supply device 100 having a reference terminal 105g, an input terminal 105i, and two output terminals 105oh and 105ol. The terminal 105g is connected to a reference terminal (or ground) and the input terminal 105i is connected to the positive terminal of a main supply (the negative terminal of which is connected to the ground terminal) in order for a supply voltage +Vcc to be applied to the input terminal 105i. A positive supply voltage +Vee and a negative supply voltage −Vee of substantially opposite polarities or values (relative to ground) are available at the output terminals 105oh and 105ol, respectively; the positive voltage +Vee and the negative voltage −Vee supply a load LDh (connected between the output terminal 105oh and the ground terminal) and a load LDl (connected between the output terminal 105ol and the ground terminal), respectively.

This supply device 100 is used in a disk memory system (not shown in the drawing). In particular, the positive supply voltage +Vee and the negative supply voltage Vee are supplied to a driver circuit of a piezoelectric actuator; the supply voltages +Vee and −Vee are used to polarize one or more chips of piezoelectric material in opposite directions so as to bring about bi-directional movements of a free end (a wrist) of a suspension arm on which a reading and writing head is disposed. In this application, the main supply voltage +Vcc typically has a value of between +5V and +12V, whereas the positive supply voltage +Vee and the negative supply voltage −Vee typically have absolute values of between 20V and 80V. The supply device of the present invention may, however, also be used in other applications such as for supplying a serial transmission interface in a personal computer (PC), for example, an RS 232 interface (with a positive and a negative supply voltage equal to +12V and −12V, respectively), etc.

A step-up dc/dc converter 110 is connected between the input terminal 105i and the output terminal 105oh in order to obtain, from the main supply voltage +Vcc, the positive supply voltage +Vee (a higher value than the main supply voltage +Vcc). The converter 110 is constituted by an n-channel field-effect MOS power transistor M1n having its source terminal connected to the reference terminal 105g and its drain terminal connected to a first terminal of an inductor L1, the second terminal of which is connected to the input terminal 105i. A control terminal of a control circuit (CTRL) 115 is connected to the gate terminal of the transistor M1n, by means of a buffer B1. A freewheeling diode is connected, by its anode terminal and by its cathode terminal, to the source terminal and to the drain terminal of the transistor M1n, respectively. The dc/dc converter 110 includes a diode D1 having its anode terminal connected to the drain terminal of the transistor M1n and its cathode terminal connected to the first terminal of a capacitor C1 the second terminal of which is connected to the reference terminal 105g. The cathode terminal of the diode D1 is also connected to the output terminal 105oh and to a feedback terminal of the control circuit 115. Alternatively, the dc/dc converter may have a different structure and may be of the step-down type if the positive supply voltage has a lower value than the main supply voltage, etc.

In the supply device according to one embodiment of the present invention, a capacitive translator 120 (described in detail below) is connected between the output terminal 105oh and the output terminal 105ol in order to obtain the negative supply voltage −Vee from the positive supply voltage +Vee.

This solution requires a single control circuit and a single inductor. The supply device is therefore simple and inexpensive, particularly when it is produced in integrated form in a chip of semiconductor material.

It should be noted that the negative supply voltage −Vee is not stabilized and thus varies appreciably with variations in the load LD1. In the applications in question, however, this does not constitute a problem since it is not necessary for the negative supply voltage −Vee to be rigorously constant.

In the embodiment shown in the drawing, the translator 120 includes an inverter constituted by a half-bridge formed by a p-channel MOS power transistor M2p and by an n-channel MOS power transistor M2n connected to one another in a complementary, symmetrical manner. In particular, a further control terminal of the control circuit 115 is connected to the gate terminals of the transistors M2p and M2n, by means of a buffer B2. The source terminal of the transistor M2p is connected to the output terminal 105oh, and the source terminal of the transistor M2n is connected to the reference terminal 105g; the drain terminals of the transistors M2p and M2n are connected to one another and constitute an output terminal of the inverter M2p, M2n (node N2i).

A voltage multiplier circuit (in particular a voltage doubler) comprising a clamper circuit and a circuit for charging a capacitor is connected in cascade with the inverter M2p, M2n. The damper circuit is constituted by a capacitor C2a having a first terminal connected to the output terminal N2i of the inverter M2p, M2n and a second terminal connected to the anode terminal of a diode D2a, the cathode terminal of which is connected to the reference terminal 105g; the anode terminal of the diode D2a constitutes an output terminal of the damper circuit C2a, D2a (node N2a). The charging circuit is constituted by a diode D2b having its cathode terminal connected to the output terminal N2a of the damper circuit C2a, D2a and its anode terminal connected to the output terminal 105ol and a capacitor C2b connected between the output terminal 105ol and the reference terminal 105g.

Figure 1B:
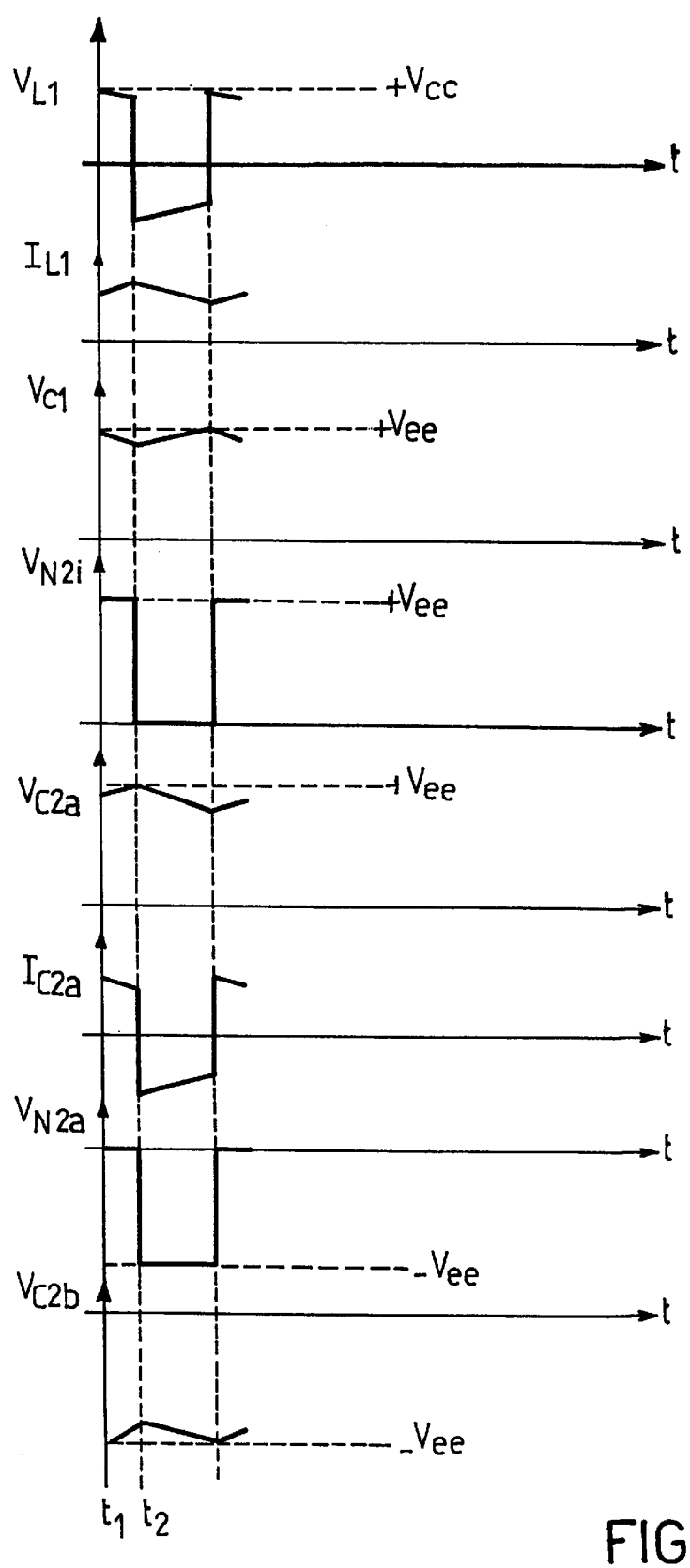
FIG. 1b shows the variation of electrical quantities of the supply device in a qualitative time graph.

With reference to FIGS. 1a and 1b in combination, the control circuit 115 switches the transistor M1n via the buffer B1 (which supplies the power necessary for the driving thereof). The transistor M1n is brought alternately to a conductive (saturation) state and to a non-conductive state; the ratio between the durations of the conductive and non-conductive states is regulated so as to achieve an output voltage of mean value equal to +Vee.

When, at a moment t1, the transistor M1n becomes conductive, the diodes D1fw and D1 are non-conductive (since a voltage $V_{C1}$ at the terminals of the capacitor C1 is equal to the value +Vee in a steady state). A voltage $V_{L1}$ at the terminals of the inductor L1 is instantaneously brought to the value +Vcc; the inductor L1 stores energy supplied by the main supply so that the voltage $V_{L1}$ decreases and a current $I_{L1}$ through the inductor L1 increases over time. The capacitor C1 supplies the necessary energy to the load LDh, so that the voltage $V_{C1}$ decreases slightly over time.

When, at a subsequent moment t2, the transistor M1n is made nonconductive, since the current $I_{L1}$ cannot change instantaneously, it flows through the diode D1 towards the capacitor C1 and the load LDh. The voltage $V_{L1}$ is brought instantaneously to a value of opposite sign (equal to the difference between the voltage +Vee and the voltage $V_{C1}$); the freewheeling diode D1fw acts as protection against any opening inverse over voltages in the transistor M1n. The inductor L1 supplies the energy previously stored to the load LDh and to the capacitor C1 so that the voltage $V_{L1}$ (in absolute value) and the current $I_{L1}$ decrease over time and the voltage $V_{C1}$ returns to the value +Vee.

The voltage at the output terminal 105oh is thus kept substantially constant at the value +Vee, with a slight ripple. This voltage is supplied as an input to the control circuit 115 so as to be kept at the predetermined value by means of a feedback control which acts on an oscillator-modulator in accordance with the pulse-width modulation (or PWM) principle.

At the same time, the control circuit 115 switches the transistors M2p and M2n, via the buffer B2; in particular, the transistor M2p is alternately made conductive (with the transistor M2n non-conductive) and non-conductive (with the transistor M2n conductive). The transistors M2p, M2n are preferably switched at a frequency equal to that of the switching of the transistor M1n (although the use of a different frequency is not excluded) so as to prevent interference phenomena (intermodulation) between the dc/dc converter 110 and the translator 120.

When, at the moment t1, the transistor M2p is made conductive and the transistor M2n is made non-conductive, a voltage VN2i at the output terminal N2i of the inverter M2p, M2n adopts the value +Vee. Since, in the steady state, the capacitor C2a is charged to a voltage VC2a lower than the value +Vee, the diode D2a is conductive so that a voltage $V_{N2a}$ at the output terminal N2a of the clamper circuit C2a, D2a has a value of zero (ignoring a threshold value of the diode D2a). A current $I_{C2a}$ passes through the capacitor C2a which stores energy and is charged through the transistor M2p and the diode D2a to the voltage +Vee (with the current $I_{C2a}$ decreasing over time). The diode D2b, however, is non-conductive, since the capacitor C2b is charged to a voltage Vc₂b equal to the value −Vee in the steady state. The capacitor C2b supplies the necessary energy to the load LD1 so that the voltage $V_{C2b}$ decreases in absolute value over time.

When, at the moment t2, the transistor M2p is made non-conductive and the transistor M2n is made conductive, the voltage $V_{N2i}$ adopts the value of zero; since the voltage $V_{C2a}$ cannot change instantaneously, the voltage $V_{N2a}$ is brought to the value −Vee; the diode D2a is therefore made non-conductive and the diode D2b becomes conductive. The current $I_{C2a}$ is reversed and the capacitor C2a supplies the energy previously stored to the load and to the capacitor C2b so that the current $I_{C2a}$ (in absolute value) and the voltage $V_{C2a}$ decrease over time and the voltage $V_{C2b}$ is brought to the value −Vee.

The voltage $V_{N2i}$ thus alternates (with a rectangular wave form) between the value +Vee and zero and, similarly, the voltage $V_{N2a}$ alternates (with a rectangular wave form) between zero and the value −Vee. The voltage at the output terminal $105_{ol}$, however, is approximately constant at the value −Vee (with a more or less consistent ripple dependent on a current absorbed by the load LD1).

The structure described above is particularly simple and effective. In particular, the capacitive load (not an inductive load) connected to the inverter M2p, M2n prevents transitory overvoltage phenomena (overshoot) at the terminals of the transistors M2p and M2n (caused by a large variation of the current over time). It is thus not necessary to use a protection device for the transistors M2p and M2n; moreover, the signals used to switch the transistors M2p, M2n can have very steep leading and trailing edges, speeding up the switching stages with a consequent reduction in power losses during switching.

Similar considerations apply if equivalent inverter, damper and charging circuits are used, if the translator is formed with a different structure (but, in any case, without an inductor), if a single buffer is provided for switching all of the power transistors (with a single signal) etc.

Naturally, in order to satisfy contingent and specific requirements, an expert in the art may apply to the above-described dual supply device many modifications and variations all of which, however, are included within the scope of protection of the invention as defined by the following claims.

What is claimed is:

1. A dual supply device, comprising: a reference terminal, an input terminal for the application of a substantially constant input voltage relative to the reference terminal, a first output terminal for supplying a first supply voltage different from the input voltage, and a second output terminal for supplying a second supply voltage substantially opposite to the first supply voltage, a direct-current/direct-current converter connected between the input terminal and the first output terminal for converting the input voltage into the first supply voltage, and a capacitive translator connected between the first and second output terminals for translating the first supply voltage into the second supply voltage, the capacitive translator including an inverter for obtaining, from the first supply voltage, a first alternating voltage variable between the value of the first supply voltage and a zero value of the reference terminal, and a voltage multiplier circuit for obtaining the second supply voltage from the first alternating voltage.

2. The supply device of claim 1 wherein the direct-current/direct-current converter is of the step-up type, wherein the first supply voltage is greater than the input voltage.

3. The supply device of claim 1 wherein the direct-current/direct-current converter includes a first power transistor and a control circuit for switching the first transistor, the inverter comprising a second power transistor and a third power transistor with opposite polarities to one another and having respective first power terminals connected to the first output terminal and to the reference terminal, respectively, respective control terminals connected together to the control circuit for switching the second and third transistors, and respective second power terminals connected to one another, for supplying the first alternating voltage.

4. The supply device of claim 3 wherein the second transistor is a p-channel MOS transistor and wherein the third transistor is an n-channel MOS transistor, the respective first power terminals, second power terminals and control terminals being source terminals, drain terminals and gate terminals, respectively.

5. The supply device of claim 3 wherein the control circuit switches the first transistor and switches the second and third transistors at the same frequency.

6. The supply device of claim 1 wherein the voltage-multiplier circuit includes a damper circuit for obtaining, from the first alternating voltage, a second alternating voltage variable between the zero value and the value of the second supply voltage, and a circuit for charging a capacitor for obtaining the second supply voltage from the second alternating voltage.

7. The supply device of claim 6 wherein the damper circuit includes a first capacitor having a first terminal and a second terminal and a first diode having an anode terminal and a cathode terminal, the first terminal of the first capacitor connected to the second power terminal of the second transistor and of the third transistor for receiving the first alternating voltage, the second terminal of the first capacitor connected to the anode terminal of the first diode, and the cathode terminal of the first diode connected to the reference terminal, the anode terminal of the first diode supplying the second alternating voltage.

8. The supply device of claim 7 wherein the charging circuit includes a second diode having a cathode terminal connected to the anode terminal of the first diode for receiving the second alternating voltage and an anode terminal connected to the second output terminal, and a second capacitor connected between the second output terminal and the reference terminal.

9. A voltage supply device, comprising:
a converter circuit comprising a power transistor having a first terminal coupled to a reference voltage source, a second terminal coupled through an inductive element to a supply voltage source, and a control terminal;
an inverter having a first terminal coupled to the reference voltage source, a second terminal coupled to a first supply voltage output terminal, a control terminal, and an output terminal;
a control circuit coupled to the control terminal of the power transistor and to the control terminal of the inventor and configured to provide a control signal to the power transistor and the inverter; and
a voltage multiplier circuit coupled between the output terminal of the inverter and a second supply voltage output terminal, the voltage multiplier circuit configured to increase a voltage supplied by the inverter.

10. The device of claim 9 wherein the converter circuit further comprises a first diode coupled between the second terminal of the power transistor and the first supply voltage output terminal, and a second diode coupled between the second terminal of the power transistor and the first terminal of the power transistor.

11. The device of claim 9 wherein the control circuit comprises an input coupled to the first and second supply voltage output terminals.

12. The device of claim 11, further comprising a capacitive translator element having a first terminal coupled to the first supply voltage output terminal and the input terminal of the control circuit and a second terminal coupled to the reference voltage source and the second supply voltage output terminal.

13. The device of claim 9 wherein the first supply voltage output terminal is taken from a node formed by the connection between the second terminal of the power transistor and the inductive element.

14. The device of claim 9 wherein the voltage multiplier circuit comprises a first capacitive element coupled between the output terminal of the inverter and the second supply voltage output terminal, and a first diode element coupled to the first capacitive element and the reference voltage source.

15. The device of claim 14 wherein the voltage multiplier circuit further comprises a second capacitive element coupled between the second supply voltage output terminal and the reference voltage source, and a second diode element coupled between the second supply voltage output terminal and a node formed by the connection between the first capacitive element and the first diode element.

16. A voltage supply device, comprising:
 a converter circuit having a first terminal coupled to a reference voltage source, a second terminal coupled to a supply voltage source, a control terminal, a first output coupled to a first supply voltage output terminal, and a second output, the converter circuit comprising a power transistor having a first terminal coupled to the reference voltage source, a second terminal coupled through an inductor to the supply voltage source, a control terminal coupled to an output of the control circuit, a first diode connected by an anode terminal to the first terminal of the power transistor and by a cathode terminal to the second terminal of the power transistor, and further comprising a second diode having an anode terminal coupled to the second terminal of the power transistor and a cathode terminal coupled to the first supply voltage output;
 a translator circuit having a first supply terminal coupled to the first supply voltage output terminal, a second supply terminal coupled to the voltage reference source, a control terminal, and an output terminal coupled to a second supply voltage output terminal, the translator circuit comprising an inverter having a first terminal coupled to the first supply voltage output terminal and a second terminal coupled to the reference voltage source, the inverter further including a control terminal coupled to the control circuit and an output terminal coupled to a voltage multiplier circuit that in turn is coupled to the second supply voltage output terminal; and
 a control circuit coupled to the control terminals of the converter circuit and the translator circuit and configured to control operation of the converter circuit and the translator circuit to receive a first voltage from the supply voltage source and to output first and second supply voltages through the first and second supply voltage output terminals, respectively, with the first and second supply voltages having opposite polarities of substantially equal value that is greater than the value of the supply voltage.

17. The device of claim 16 wherein the voltage multiplier circuit comprises a damper circuit and a charging circuit connected in series between the inverter and the second supply voltage output terminal.

* * * * *

UNITED STATES PATENT AND TRADEMARK OFFICE
CERTIFICATE OF CORRECTION

PATENT NO. : 6,222,351 B1
DATED : April 24, 2001
INVENTOR(S) : Luca Fontanella et al.

It is certified that error appears in the above-identified patent and that said Letters Patent is hereby corrected as shown below:

Title page,
Item [54], the title should read -- BOOST REGULATOR WITH AN INVERTED AND NON-INVERTED OUTPUT --.
Item [75], the first listed inventor's residence should read -- Venezia, ITALY --.
Item [30], The Foreign Application Priority Data should read -- January 20, 1999 [IT]................... MI99A 000093

Column 6, claim 6,
Line 5, "includes a damper circuit" should read -- includes a clamper circuit --.

Column 6, claim 7,
Line 11, "wherein the damper" should read -- wherein the clamper --.

Column 8, claim 17,
Line 24, "comprises a damper circuit" should read -- comprises a clamper circuit --.

Signed and Sealed this

Nineteenth Day of February, 2002

Attest:

JAMES E. ROGAN
*Director of the United States Patent and Trademark Office*

*Attesting Officer*